United States Patent
Brass et al.

(10) Patent No.: US 6,838,917 B2
(45) Date of Patent: Jan. 4, 2005

(54) CIRCUIT CONFIGURATION FOR PROCESSING DATA, AND METHOD FOR IDENTIFYING AN OPERATING STATE

(75) Inventors: Eckhard Brass, Unterhacing (DE); Bernd Klehn, Unterhaching (DE); Ralf Klein, München (DE); Thoai-Thai Le, Cary, NC (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/266,354

(22) Filed: Oct. 7, 2002

(65) Prior Publication Data

US 2003/0067334 A1 Apr. 10, 2003

(30) Foreign Application Priority Data

Oct. 5, 2001 (DE) .......................................... 101 49 104

(51) Int. Cl.[7] .............................................. H03L 7/06
(52) U.S. Cl. ...................................... 327/158; 327/161
(58) Field of Search ................................ 327/147–151, 327/156–161

(56) References Cited

U.S. PATENT DOCUMENTS 6,140,854 A * 10/2000 Coddington et al. ........ 327/158
6,310,494 B1   10/2001 Ehben et al. ................. 326/82
6,477,592 B1 * 11/2002 Chen et al. .................... 710/52

FOREIGN PATENT DOCUMENTS

| DE | 198 03 757 A1 | 8/1999 |
| DE | 199 10 885 A1 | 10/2000 |
| WO | 01/63742 A1 | 8/2001 |

* cited by examiner

*Primary Examiner*—Quan Tra
(74) *Attorney, Agent, or Firm*—Laurence A. Greenberg; Werner H. Stemer; Ralph E. Locher

(57) ABSTRACT

A circuit configuration for processing data, particularly a semiconductor memory chip, has a control circuit for setting a phase or frequency relationship between two signals. A digital counter detects a phase or frequency difference between the two signals, and the counter reading is used for regulating the phase or frequency relationship. Trials have shown that the counter reading indicates an operating state in the circuit configuration and therefore represents a simple signal for assessing the operating state of the circuit configuration. Preferably, the counter reading is taken as a basis for adjusting the speed or power of time-critical or performance-critical circuit parts in the circuit configuration so that an operating state with an intermediate switching speed is obtained.

8 Claims, 4 Drawing Sheets

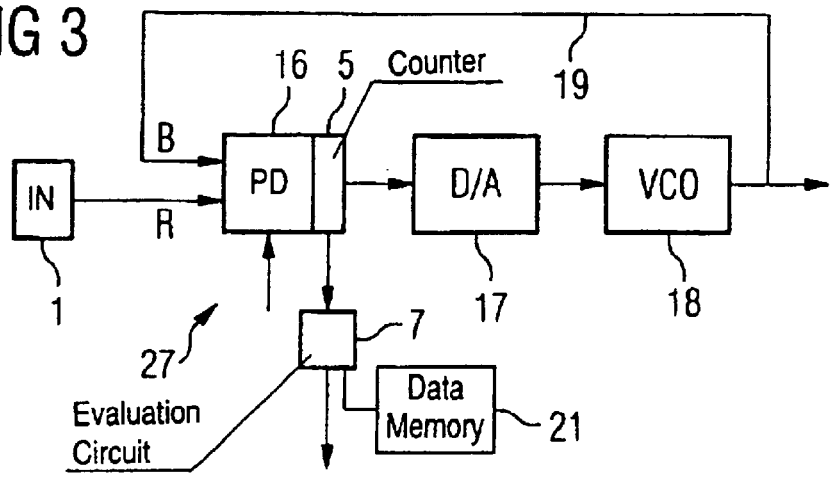
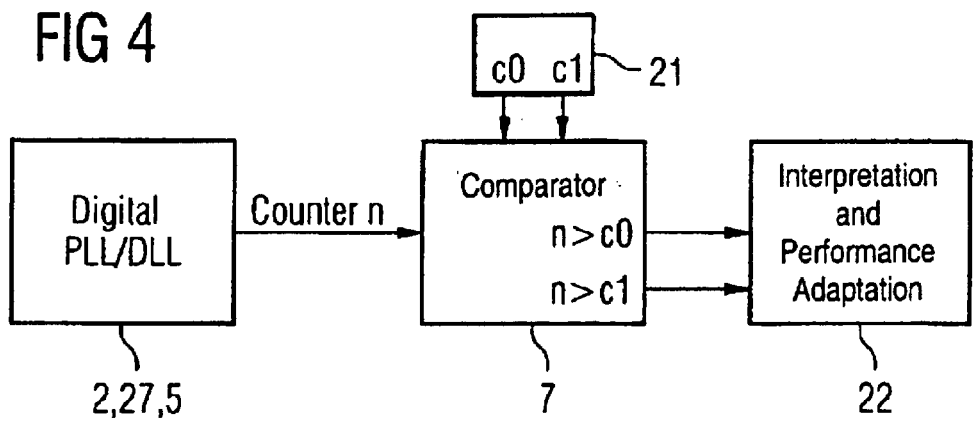
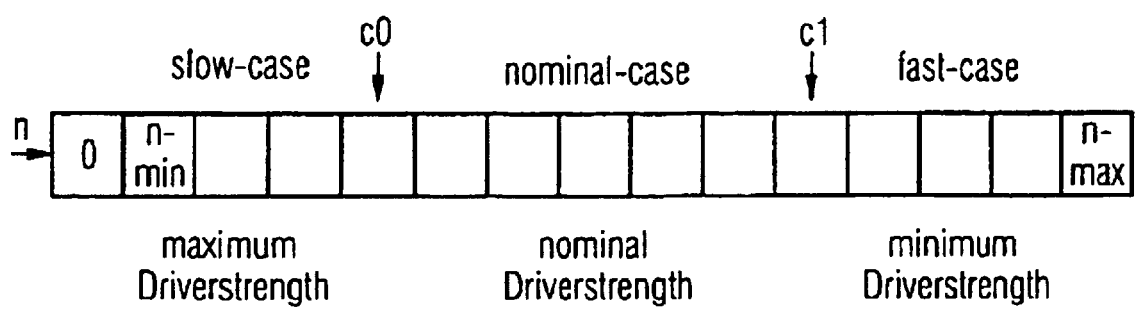

CIRCUIT CONFIGURATION FOR PROCESSING DATA, AND METHOD FOR IDENTIFYING AN OPERATING STATE

BACKGROUND OF THE INVENTION

Field of the Invention

The invention relates to a circuit configuration for processing data, particularly a semiconductor memory chip. The configuration includes a control circuit which has a digital counter and puts a second signal into a prescribed phase or frequency relationship with respect to a first signal. The phase or frequency difference between the first second signals is detected using the counter. The counter outputs a counter signal, which the control circuit uses as a control signal for setting the phase or frequency of the second signal.

The invention also relates to a method for detecting an operating state in an integrated circuit, particularly in a semiconductor memory chip. The circuit has a control circuit for setting a phase relationship or a frequency relationship between two signals and the control circuit has a counter which is used to detect a phase difference or frequency difference in the two signals. The counter reading on the counter is used for regulating the phase or frequency relationship.

The scale of integration and the functionality of circuit configurations such as integrated circuits in the form of a semiconductor memory chip are increasing to an ever greater extent. In addition, the working life needs to be increased, the current consumption needs to be reduced, and the range of use for the circuit configuration needs to be extended. In addition, the clock rate for circuit configurations for processing data, such as semiconductor memory chips, is being increased, which means that it is necessary to observe a precise clock rate.

The article "VLSI Performance Compensation for Off-Chip Drivers and Clock Generation", Dennis T. Cox et al., IEEE, 1989, Custom Integrated Circuits Conference, section 14.3.1, CH 2671-6/89/0000-0079 deals with the problem that both the driver characteristic and clock generation are affected by process parameters, by temperature and by the supply voltage. When designing driver circuits, it is necessary to observe a prescribed time delay, a maximum level of interference signal generation and a desired output impedance, although these properties are dependent on the fabrication process used, on the supply voltage and on the temperature. Typical process variations in the fabrication of the integrated circuit can cause discrepancies in the time delay of, typically, 0.6 to 1.5×a normal time delay. A similarly large bandwidth is achieved by a change in the supply voltage and a change in the temperature of the circuit configuration. The interference signals caused by a driver circuit are likewise dependent on the fabrication process, on the supply voltage and on the temperature. Similar problems arise when generating a precise clock signal. A precise clock signal is likewise affected by the semiconductor process used, by the supply voltage and by the temperature of the circuit configuration.

To avoid these problems, an operation measuring element is proposed which is integrated on the semiconductor memory chip. The operation measuring element detects changes in the operating state which are produced on account of the fabrication process, the ambient temperature and the supply voltage. The operation measuring element passes the detected operating state to a driver circuit and to a clock source for the purpose of controlling the operating characteristics thereof.

The operation measuring element has an oscillator as a clock source, the signal from this oscillator being passed via an inverter chain. During this process, the signal is monitored to determine how far it is forwarded in the inverter chain in a prescribed time period. Depending on the number of inverters through which the clock signal passes during the prescribed time period, an operating state in the circuit configuration is detected which categorizes the circuit configuration's processing speed between very slow operation and very fast operation. On the basis of the operating state ascertained, the operating response of the driver circuits and of the clock source is changed, so that a slow or a fast operating state is compensated for. On the basis of the operating state, the driver circuit is controlled such that the delay produced by the driver circuit varies by, typically, ±15% with respect to a prescribed nominal delay. To this end, the driver power is preferably varied by ±30% in relation to the time derivative for the current which is output by the driver circuit.

The commonly assigned U.S. Pat. No. 6,310,494 and the corresponding German patent publication DE 198 03 757 A1 disclose a bus driver having an inverter for driving a preferably clocked signal on a bus line, whose driver strength can be dynamically matched to signals from adjacent, capacitively coupled bus lines.

Circuit configurations such as semiconductor memory chips require, on the basis of a first signal, which represents an input signal, a second signal which has a defined phase relationship or a defined frequency relationship with respect to the first signal. To define a phase relationship, delay locked loop circuits are used. A corresponding delay locked loop circuit is known from German patent DE 19 910 885 C2. To define a particular frequency relationship, phase locked loop circuits are used. A corresponding phase locked loop circuit is known from International PCT publication WO 01/63742 A1, for example.

SUMMARY OF THE INVENTION

It is accordingly an object of the invention to provide circuit configuration for processing data, particularly a semiconductor memory chip, and a method of monitoring a processing state which overcome the above-mentioned disadvantages of the heretofore-known devices and methods of this general type and wherein the operating state of the circuit configuration can be ascertained using a simple circuit configuration. The object of the invention is also to provide a method that allows simple assessment of the operating state of a circuit configuration.

With the foregoing and other objects in view there is provided, in accordance with the invention, a circuit configuration for processing data, having a control circuit configured to set a phase or a frequency of a second signal with a prescribed phase or frequency relationship with respect to a first signal, the control circuit having a digital counter for detecting a phase or frequency difference between the first signal and the second signal, and the counter outputting a counter signal acting as a control signal of the control circuit for setting the phase or frequency of the second signal. An evaluation circuit is provided to receive the counter signal and the evaluation circuit assesses an operating state of the circuit configuration based on a counter reading.

With the above and other objects in view there is also provided, in accordance with the invention, a method for detecting an operating state in an integrated circuit having a control circuit for setting a phase relationship or a frequency relationship between two signals, and the control circuit having a counter. The method comprises the following steps:

detecting a phase difference or a frequency difference between the two signals with the counter and outputting a counter signal;

using the counter signal for regulating the phase relationship or the frequency relationship; and determining from the counter reading an operating state in the circuit.

In other words, a simple circuit configuration for processing data whose operating state can be ascertained is achieved by virtue of a counter reading on a counter in a control circuit which can be used to set a prescribed phase or frequency relationship between two signals in the circuit configuration being supplied to an evaluation circuit. The evaluation circuit assesses the operating state of the circuit configuration on the basis of the counter reading. In this way, the operating state of the circuit configuration is detected on the basis of the normally present counter reading on the counter without producing a complex monitoring unit. This avoids producing a complex monitoring unit.

Preferably, the counter signal is taken as a basis for switching at least part of the circuit configuration to a changed operating mode which is matched to the operating state of the circuit configuration. This allows improved operation of the circuit configuration.

To obtain a high yield when fabricating circuit configurations such as DRAM memory chips, it is necessary for as many memory chips as possible to have a desired standard functionality. The standard functionality can affect a multiplicity of parameters, preferably the switching speed of the transistors in the circuit configuration. Variations in the quality of the fabrication process mean that discrepancies can arise in the standard functionalities of the circuit configuration, particularly of the transistors, and these discrepancies would result in a poorer yield.

If a circuit configuration has a data processing speed which differs from a desired processing speed, for example on account of transistors whose switching speeds differ from desired switching speeds, then changing the operating state of at least single transistors is used to adjust the switching speed of the transistors such that the processing speed of the circuit configuration is shifted in the direction of the desired processing speed. This compensates for fabrication-related properties of the circuit configurations which differ from a standard functionality. This achieves, overall, a better yield of circuit configurations having a standard functionality when fabricating circuit configurations.

Preferably, upon identification of a slow operating state in the circuit configuration, which is dependent on the voltage supply or on the temperature, for example, at least a part of the circuit configuration which affects the circuit configuration's clock frequency can be switched to a faster operating mode. This preferably results in an intermediate operating state being observed which has, by way of example, an intermediate clock frequency despite the unfavorable operating state. This prevents a slow operating state, for example caused by a high ambient temperature or an excessively low voltage supply, from adversely affecting the operability of the circuit configuration.

In another instance of application, it is advantageous, upon identification of a fast operating state in the circuit configuration, for at least parts of the circuit configuration which affect the circuit configuration's clock frequency to be switched to a slower operating state. This operates the circuit configuration in an improved operating mode overall. By way of example, the relatively slow operating mode can achieve a lower current consumption or a lower load on the circuit configuration or a lower evolution of heat.

In another embodiment of the invention, the evaluation circuit takes the counter reading as a basis for identifying an operating state in the circuit configuration wherein at least parts of the circuit configuration can also be operated at lower power in order to observe a prescribed clock frequency range. In this state, the evaluation circuit switches at least one voltage generator in the circuit configuration to an operating state with relatively low power consumption and relatively low power output. In this way, the desired clock frequency is observed and also less current is consumed.

In accordance with an added feature of the invention, the evaluation circuit changes the driver strength of a driver circuit on the basis of the counter signal on the digital counter. If the circuit configuration is in an operating state wherein the functionality of the circuit configuration is in the limit region for an excessively fast functionality, for example, then the driver strength is reduced. This shifts the speed of the circuit configuration in the direction of a lower but adequate speed.

However, if the circuit configuration is in an operating state wherein the functionality of the circuit configuration is in the region of an excessively slow switching speed, the evaluation circuit increases the driver strength of the driver circuit. This increases the speed of the circuit configuration overall. As a result, the speed of the circuit configuration is less dependent on the operating state of the circuit configuration. This improves the observance of a desired clock frequency range or the observance of a desired clock period for a time signal.

In one simple embodiment, the evaluation circuit has a data memory, which stores values for the counter signal which are associated with operating states of the circuit configuration. The evaluation circuit can ascertain the operating state of the circuit configuration by means of simple comparison of the counter signal with the stored values. This provides a simple implementation for ascertaining the operating states of the circuit configuration on the basis of the values of the counter signal.

In another embodiment of the invention, the evaluation circuit takes into account the frequency of a first signal which is supplied to the control circuit. On the basis of the frequency of the first signal, different value ranges are stipulated for the counter signal, said value ranges being associated with various operating states of the circuit configuration. This allows simple use of the circuit configuration for different frequencies.

In another embodiment of the invention, the data memory stores values for the counter signal which are associated with a temperature of the circuit configuration together with a regulated operating voltage and a fixed operating frequency. In this way, the evaluation circuit can identify the temperature of the circuit configuration on the basis of the counter reading. It is also possible, given a known process situation, a regulated operating voltage and operating frequencies which can only assume particular values, for the operating frequency of the circuit configuration to be inferred on the basis of the counter signal. To this end, the data memory stores appropriate data.

Other features which are considered as characteristic for the invention are set forth in the appended claims.

Although the invention is illustrated and described herein as embodied in a circuit configuration for processing data, and method for identifying an operating state, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 3 is a schematic block diagram of a DLL circuit;

FIG. 4 is a block diagram of an evaluation circuit for evaluating a counter signal;

FIG. 5 is a diagram for categorizing a driver strength on the basis of a counter signal;

DESCRIPTION OF THE PREFERRED EMBODIMENTS

The invention is described below with reference to a DDR-SDRAM, but the invention can be applied to all circuit configurations for processing data which have a frequency control circuit or a phase control circuit and circuit parts whose operating mode can be adjusted and which allow the clock frequency or the speed for processing data to be influenced.

Figure 1:
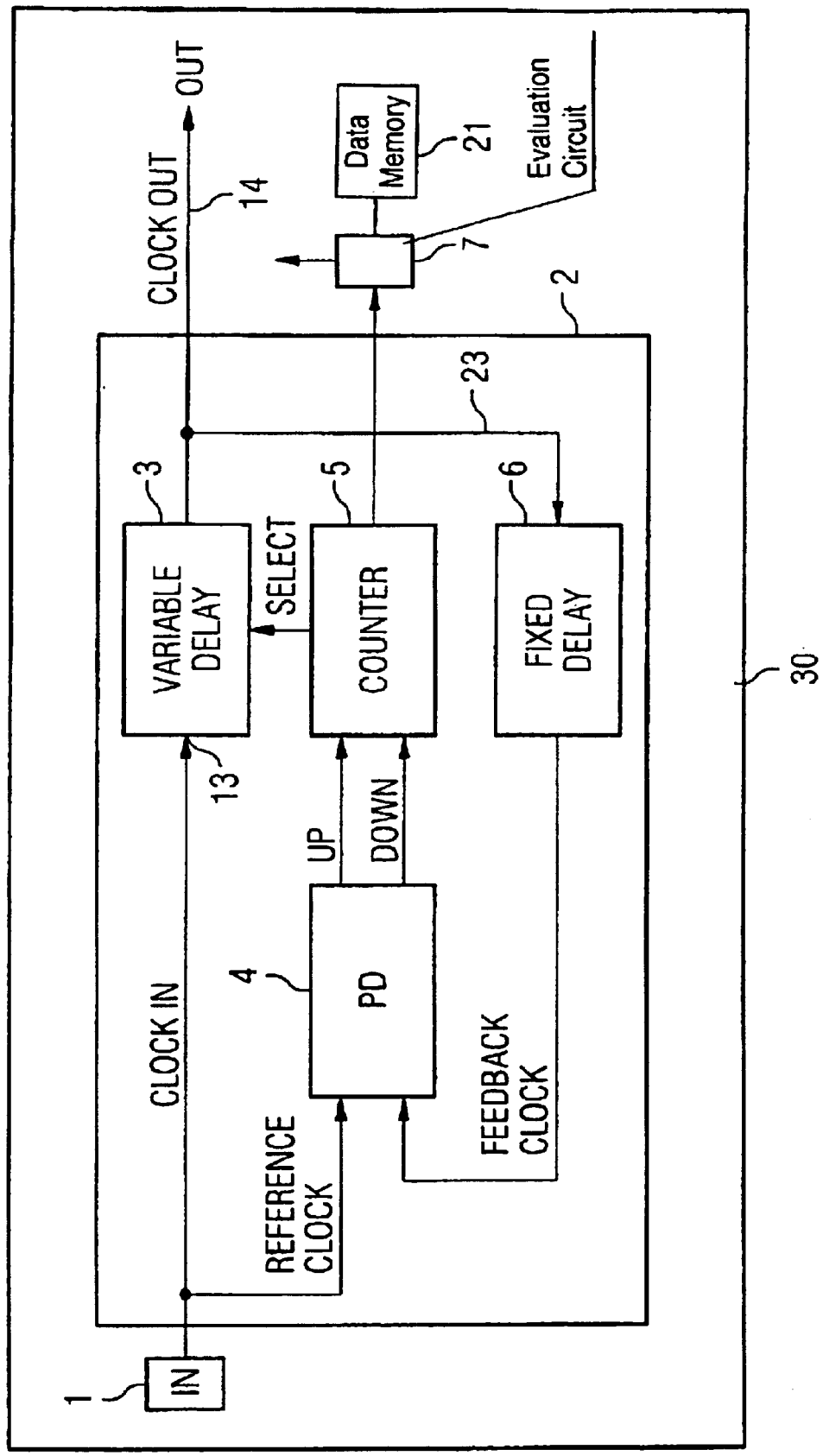
FIG. 1 is a block diagram of a detail of a semiconductor memory chip.

Referring now to the figures of the drawing in detail and first, particularly, to FIG. 1 thereof, there is shown a schematic illustration of a subdivision of a semiconductor memory chip which is preferably in the form of a double data rate SDRAM 30 and has the circuit parts which are customary for a double data rate SDRAM. However, FIG. 1 shows only the parts of the semiconductor memory chip which are fundamental to the meaning of the invention. The semiconductor memory chip has a memory matrix containing memory cells wherein information can be stored and read again. For writing and reading data, driver circuits are used. For fast processing of the data, a high clock frequency is necessary. The clock frequency at which data are written or read is derived from a reference clock. The reference clock is provided by an oscillator 1 and in this exemplary embodiment is forwarded to a delay locked loop circuit 2. The DLL circuit 2 is a regulating circuit, or closed-loop control circuit 2, with a variable delay line 3 to which the reference clock signal is supplied. From the reference clock signal, the DLL circuit 2 ascertains an operating clock signal, which is output at an output 14 of the DLL circuit 2. The operating clock is used in the data path for the purpose of data synchronization.

The task of the DLL circuit 2 is to put the operating clock signal into a defined phase relationship with respect to the reference clock signal.

The reference clock signal from the oscillator 1 is supplied to a phase detector 4. At the same time, the operating clock signal which is output by the delay line 3 is passed via a return line 23 to a delay circuit 6. The delay circuit 6 delays the operating clock signal by a prescribed delay period and supplies the delayed operating clock signal to a further input of the phase detector 4. The phase detector 4 ascertains the phase difference between the reference clock signal and the delayed operating clock signal. If the delayed operating clock signal leads the reference clock signal, then the phase detector 4 passes an Up signal to a counter 5. However, if the reference clock signal leads the delayed operating clock signal, the phase detector 4 passes a Down signal to the counter 5. The counter 5 has a counter reading and increases the counter reading by the value 1 when the phase detector 4 supplies an Up signal. If, however, the phase detector 4 supplies a Down signal, then the counter 5 reduces the counter reading by the value 1. The counter 5 forwards the counter reading as a counter signal to the variable delay line 3. The variable delay line 3 delays the reference clock signal for longer the higher the counter reading on the counter 5. In this case, the variable delay time by which the variable delay line 3 delays the reference clock signal and the defined delay period by which the operating clock signal is delayed by the delay circuit 6 give the period duration for the reference clock signal. The counter 5 passes the counter reading, in the form of the counter signal, not only to the variable delay line 3 but also to an evaluation circuit 7.

Figure 2:
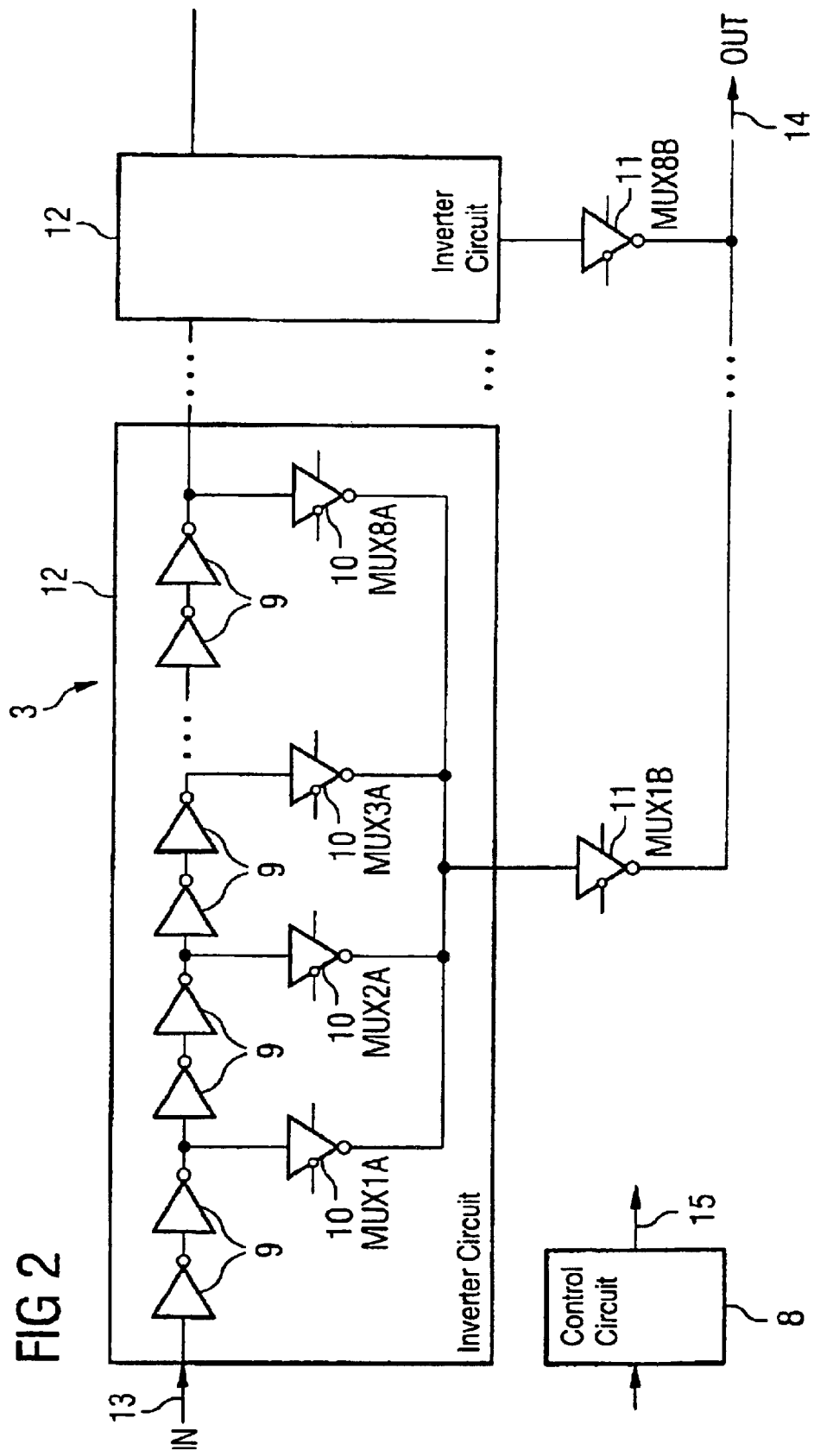
FIG. 2 is a schematic diagram of a delay line in a PLL circuit.

FIG. 2 shows a schematic design of the variable delay line 3. The variable delay line 3 has a first control circuit 8 to which the counter signal from the counter 5 is supplied. In addition, the variable delay line 3 has a chain of inverters 9, with a branch being routed to a first multiplexer 10 after two respective inverters 9. In the exemplary embodiment chosen, eight pairs of inverters 9 are combined to form an inverter circuit 12. Furthermore, eight inverter circuits 12 are connected in series. Each inverter circuit 12 has eight first multiplexers 10. In addition, each chain in an inverter circuit 12 has sixteen inverters. Each inverter circuit 12 is connected to a second multiplexer 11 via an output. The eight second multiplexers 11 are connected to the output 14. The first control circuit 8 is connected to all the first and second multiplexers 10, 11 via a first control line 15. On the basis of the control signal from the first control line 8, a first and a second multiplexer 10, 11 are turned on or off.

The reference clock signal generated by the oscillator 1 is supplied to the inverter circuit 12 via an input 13. On the basis of the counter signal supplied, the first control circuit 8 uses a control line 15 to select a first and a second multiplexer 10, 11 via which the reference clock signal is to be passed to the output 14. If, by way of example, the counter 5 has the counter signal 1, then the reference clock signal is routed to the output 14 via the corresponding first multiplexer 10 and the corresponding second multiplexer 11 after the first two inverters 9 in the first inverter circuit 12. The reference clock signal is thus delayed only by the time period which the reference clock signal requires in order to pass through two inverters 9. If, however, the counter signal from the counter 5 has the value 2, then the reference clock signal is routed to the output 14 via the corresponding first multiplexer 10 and the corresponding second multiplexer 11 only after having passed through four inverters 9 in the first inverter circuit 12. Accordingly, the counter signal can also stipulate that the reference clock signal has to pass through all the inverters 9 in all eight inverter circuits 12 before it is output as an operating clock signal at the output 14. The greater the number of inverters 9 through which the reference clock signal has to pass, the longer the time delay experienced by the reference clock signal. In this way, a time shift and hence a phase shift are achieved.

In this way, the reference clock signal is delayed until the operating clock signal, generated from the reference clock signal by the time delay, and the reference clock signal have no phase shift in the phase detector 4.

Instead of the DLL circuit 2, many circuit configurations for setting a frequency relationship between a first signal and a second signal use a PLL circuit 27, i.e. a phase locked loop circuit.

FIG. 3 shows a schematic design of a PLL circuit 27. In this case, an oscillator 1 routes a reference clock signal R having a defined frequency to a second phase detector 16. The second phase detector 16 is connected to a digital/analog converter 17 via a counter 5. The D/A converter 17 is connected to a voltage-controlled oscillator 18 via an output line. An output on the oscillator 18 outputs an operating clock signal having a frequency which is dependent on the actuating signal which is output to the oscillator 18 by the D/A converter. At the same time, the operating clock signal B is routed to a second input on the second phase detector 16 via a return line 19. The second phase detector 16 ascertains a phase difference between the operating clock signal B and the reference clock signal R. The task of the PLL circuit is to set the frequency between the reference clock signal and the operating clock signal so precisely that an existing phase shift does not change. To this end, the phase shift between the reference clock signal and the operating clock signal is ascertained and a controlled variable is defined on the basis of the phase difference using a counter 5. The output of the counter 5 is supplied to the D/A converter 17, which actuates the oscillator 18 on the basis of the counter reading on the counter 5. The oscillator 18 generates an output frequency which is defined on the basis of the actuating signal from the D/A converter 17. The counter 5 passes its counter signal to an evaluation circuit 7 via a second output 20.

In the case of a DLL circuit 2 or a PLL circuit 27, the counter signal from the counter 5 has different magnitudes on the basis of the operating state of the circuit configuration. The operating state is affected, by way of example, by the quality of the circuit configuration and/or by operating conditions. By way of example, the counter signal is dependent on the temperature of the circuit configuration. The corresponding dependency between the counter signal and the temperature is ascertained experimentally and is stored in a data memory 21. The data memory 21 is connected to the evaluation circuit 7. Preferably, counter reading ranges are defined which correspond to temperature ranges.

In addition, the counter reading on the counter 5 is also dependent on the switching speed, particularly on the switching speed of driver circuits in the circuit configuration. Corresponding experimental relationships between the counter readings on the counter 5 and a slow, intermediate or fast switching speed for the circuit configuration are likewise stored in the data memory 21.

If the circuit configuration is, by way of example, in an operating state wherein switching takes place very quickly and hence a high clock frequency is obtained, then the counter reading has the value 20, for example. If, by contrast, the circuit configuration is in an operating state wherein switching takes place relatively slowly and hence a relatively low clock frequency is obtained, then the counter reading has the value 5, for example. The counter readings differ depending on the embodiment of the circuit configuration, but a relationship between the counter readings and the clock frequency or the switching speed can be defined experimentally for each circuit configuration. In addition, a relationship between the counter reading on the counter 5 and an operating frequency of a semiconductor memory chip is also ascertained experimentally and stored in the data memory 21.

FIG. 4 shows a function block diagram which schematically shows the manner wherein the invention works. Essentially, a counter reading on a digital counter 5 is ascertained from a DLL circuit 2 or a PLL circuit 27, said counter 5 defining the controlled variable for the DLL circuit 2 or the controlled variable for the PLL circuit. The counter reading is supplied to an evaluation circuit 7. The evaluation circuit 7 is connected to a data memory 21. In a simple embodiment, a first value $C_0$ and a second value $C_1$ are stored for the counter reading. If the counter reading is below the first value $C_0$, then the circuit configuration is in an operating state wherein the circuit configuration operates relatively slowly and is thus in the lower region of a permissible clock frequency range. If the counter reading is above the second value $C_1$, then the circuit configuration is in an operating state wherein the circuit configuration is in an upper region of the permissible frequency range and operates relatively fast. On the basis of the comparison with the first and second comparison values $C_0$, $C_1$, the evaluation circuit 7 ascertains, in an interpretation block 22, the operating state and/or one of a plurality of measures which need to be taken on the basis of the counter reading in order to shift the operating state to a desired operating state. If the counter reading is between the first and second comparison values $C_0$, $C_1$, then the circuit configuration is in a normal, i.e. desired, operating state.

In one preferred embodiment, the limit values $C_0$, $C_1$ defined by the first and second values are stored on the basis of the frequency of the first signal which is supplied to the DLL circuit 2 or to the PLL circuit 27. The period duration of the first signal defines the time period which the counter 5 has for counting. Hence, the stabilized counter reading on the counter is simultaneously affected by the frequency. This allows the invention to be used for different frequencies if the frequency used for clocking the counter 5 is taken into account.

In a chosen exemplary embodiment, the evaluation circuit 7 adjusts the driver strength of at least one driver circuit in the circuit configuration on the basis of the counter reading on the counter 5. By increasing the driver strength, the switching speed of the driver circuit is increased at the cost of current consumption. If the counter reading is below the first comparison value $C_0$, then the circuit configuration is in a relatively slow operating state, which means that the evaluation circuit 7 increases the driver strength of the driver circuit and preferably increases it up to a maximum value. If the counter reading is between the first and second comparison values $C_0$, $C_1$, then the circuit configuration is in a normal operating state. In the circuit configuration's normal operating state, the evaluation circuit 7 sets an intermediate driver strength for the driver circuit. If the counter reading exceeds the second comparison value $C_1$, then the circuit configuration is in a relatively fast operating state. In the circuit configuration's fast operating state, the evaluation circuit 7 reduces the driver strength of the circuit configuration preferably down to a minimum driver strength. At a minimum driver strength, less current is consumed and also the switching speed required for a normal operating state is observed.

FIG. 5 shows counter reading ranges which are associated with driver strengths. A corresponding association is stored in the data memory 21. On the basis of the existing counter reading on the counter 5, the evaluation circuit 7 adjusts the driver circuit's driver strength accordingly so that a desired operating state is reached.

Besides or instead of the driver strength of a driver circuit, the evaluation circuit 7 adjusts at least one voltage generator as appropriate. By way of example, when the circuit configuration is in a fast operating state, the voltage of the voltage generator is reduced and hence also the driver strength of the driver circuit supplied by the voltage generator is reduced. This means that on the whole a slow operating state, but one which is in the normal range, is achieved for the circuit configuration and also unnecessary current consumption is avoided.

The evaluation circuit 7 can also perform just one evaluation of the circuit configuration's operating state, said evaluation being used, by way of example, to assess the operability of the circuit configuration. In addition, the evaluation circuit 7 can affect not only a driver circuit or a voltage generator but also any other critical circuit parts of the circuit configuration, so that, overall, a normal operating state, i.e. a suitable speed, is observed, which means that an excessively low or excessively high speed and/or unnecessary current consumption are avoided.

The present invention describes a method which allows the present operating state of an integrated circuit, particularly a semiconductor memory chip, to be detected with relatively little complexity. This involves using a digital on-chip frequency or phase control circuit. Frequency control circuits are generally phase locked loop circuits which multiply a clock frequency applied externally, e.g. using a crystal oscillator. PLL circuits are already integrated, by way of example, on many microcontroller chips and therefore do not need to be produced additionally. Phase control circuits are generally produced in the form of DLL circuits which match the phase of an internal signal to an external clock signal. DLL circuits are part of every double data rate dynamic memory (DDR-SDRAM). Digital PLL and DLL circuits have the property that the frequency or phase is regulated by adjusting a digital counter which affects the frequency or phase. The counter reading affects the frequency of the PLL or the phase of the DLL. Hence, in the case of a stabilized PLL/DLL, the present operating state is mapped on a counter reading. By evaluating the counter reading, the integrated circuit can be adjusted such that, by way of example, an operating environment which would result in a slow processing speed is counteracted by activating a relatively fast operating mode in at least part of the integrated circuit.

The way wherein the DLL circuit works involves in an external clock signal being passed via a delay chain. The path, i.e. the number of delay elements through which the signal needs to pass, is regulated such that the delay caused by the delay chain and a prescribed delay period correspond to exactly one period length of the clock signal. In the chosen exemplary embodiment, a delay element comprises two inverter circuits. Since an inverter's delay is dependent on the ambient conditions, such as the temperature, the operating voltage and the fabrication process used, a different number of delay elements is set for different ambient conditions. The number of activated delay elements is indicated by a counter.

Simulation makes it possible, by way of example, to find the counter reading which is set when the ambient conditions result in a circuit configuration at maximum speed. This is the case, by way of example, with a low temperature, a high operating voltage and a fabrication process which results in transistors switching at very high speed. In this case, a maximum counter reading is reached. Similarly, there are specific counter readings for a normal operating state and a slow operating state in the circuit configuration. A slow operating state in the circuit configuration corresponds to a low counter reading.

The counter reading can be taken as a basis for setting time-critical and/or performance-critical circuit parts of the circuit configuration. This can be done either directly, i.e. for each counter reading there is a dedicated mode for the critical circuit parts, or by forming performance ranges. By way of example, the counter reading is split into sections. If the circuit configuration is in a slow operating state, then critical circuit parts are switched to a high performance mode and hence the ambient conditions are compensated for at least in part.

In one development of the invention, a static output current characteristic curve for an off-chip driver is adjusted. If, by way of example, the circuit configuration is in a fast operating state, then the static output current for the driver circuit is reduced. If the circuit configuration is in a slow operating state, then the driver strength is increased.

Since the information about the present operating state is available in digital form, these signals can easily be routed to all time-critical and/or performance-critical circuit parts, such as off-chip drivers, clock drivers, etc., in order to adjust them as appropriate.

An advantage for the applicability of the invention is the knowledge of the frequency of the first signal, since the counter reading is also dependent on the period duration of the first signal. The invention is thus not stipulated for a single clock frequency, since, by way of example, it is possible to cover a higher clock frequency by raising the counter limits. Preferably, the counter limits are stored in the data memory 21 on the basis of the clock frequencies of the first signal.

Another application of the invention is during the test phase on a semiconductor memory chip, wherein the PLL or DLL circuit operates under defined ambient conditions, such as a standard temperature, a standard voltage and a known frequency, so that the counter reading now depends only on process parameters in the fabrication process. In this case, possibly chip-specific circuit parts could then be matched to existing process parameters. By way of example, a more powerful driver mode could be defined generally for process parameters which result in a slowly operating circuit configuration.

It is likewise possible, with three given variables, to infer the fourth variable. By way of example, with known process parameters, a known regulated operating voltage and a fixed operating frequency, it is possible to infer the present temperature of the circuit configuration from the counter reading.

It is also possible, given known process parameters, a known regulated operating voltage and operating frequencies which can only assume particular values, to infer the operating frequency if the effect of temperature does not cause the counter readings for the individual operating frequencies to overlap. In the case of memory chips, operating frequencies of 66 MHz, 100 MHz or 133 MHz are normally used.

Figure 6:
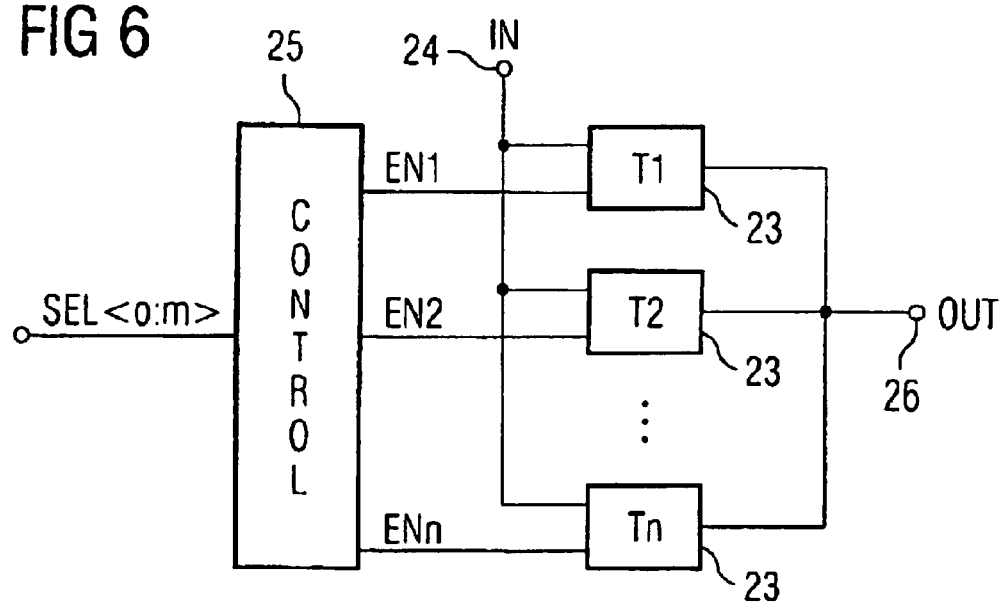
FIG. 6 is a schematic block diagram of a driver circuit with adjustable driver strength.

FIG. 6 shows a simple exemplary embodiment of a driver circuit whose driver strength, i.e. its output current overall and preferably the change in the output current over time, can be adjusted on the basis of a counter signal from the counter 5. To this end, a plurality of drivers 23 are connected in parallel which are supplied with an input signal via an input 24. In the case of a DDR-SDRAM, the input signal is in the form of a data signal, for example. In addition, a second control circuit 25 is provided whose input has the counter signal from the counter 5 applied to it. The second control circuit 25 is connected to the drivers 23 by means of enable lines 26. On the basis of the counter signal from the counter 5, a different number of drivers 23 are activated by means of enable signals. The enable signals are supplied to the drivers by the second control circuit 25 via the enable lines. The driver circuits are of identical design, for example, but it is also possible to use drivers of different design, depending on the desired application. The drivers 23 each have an output, which are combined to form a common output 26. Thus, on the basis of the counter signal from the counter 5, the signal which is output at the common output 26 is controlled in terms of current strength and change in current strength over time on the basis of the counter signal.

Figure 7:
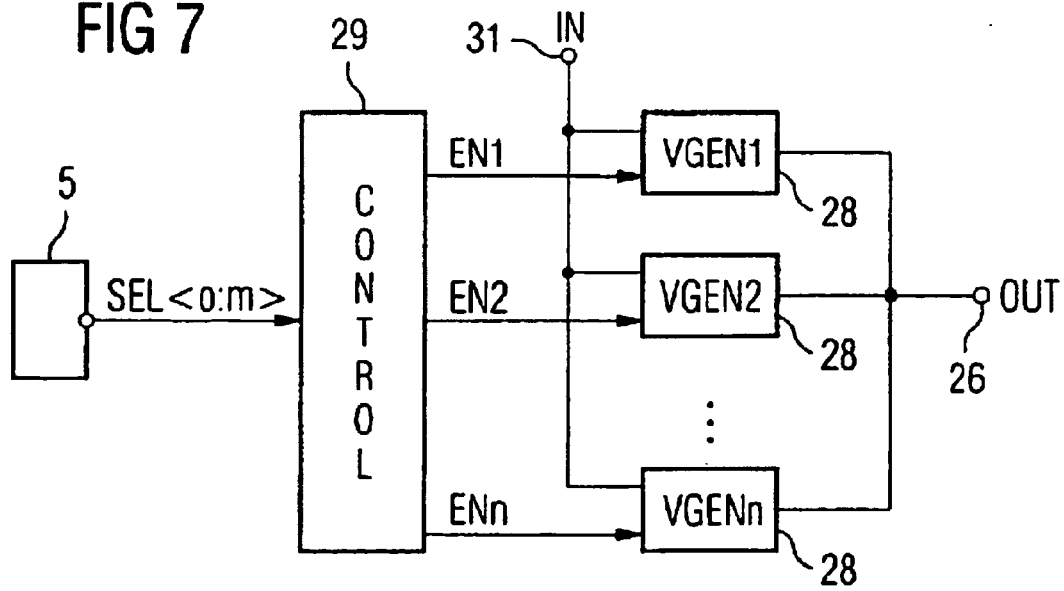
FIG. 7 is a schematic block diagram of a voltage generator circuit with adjustable power.

FIG. 7 shows a circuit configuration comprising a plurality of voltage generators 28 which are connected in parallel and can be turned on or off by means of a third control circuit 29 on the basis of the counter signal from the counter 5 or in different numbers in order to provide a supply voltage. Each voltage generator is supplied with current via a supply line 31. The circuit configuration allows the power which can be output via the common output to be controlled. On the basis of the counter reading on the counter 5 which is supplied to the third control circuit 29, the third control circuit 29 switches a greater or lesser number of voltage generators to an operating state wherein the voltage generator provides no output current or provides an output current. Turning off a voltage generator has the advantage that current is saved. The circuit configuration comprising the voltage generators in FIG. 7 is designed on the basis of the circuit configuration comprising the driver circuits in FIG. 6 and works in a similar manner.

We claim:

1. In a circuit configuration for processing data, having a control circuit configured to set a phase or a frequency of a second signal with a prescribed phase or frequency relationship with respect to a first signal, said control circuit having a digital counter for detecting a phase or frequency difference between the first signal and the second signal, and said counter outputting a counter signal acting as a control signal of said control circuit for setting the phase or frequency of the second signal, the improvement which comprises:

an evaluation circuit connected to receive the counter signal and configured to assess an operating state of the circuit configuration on a basis of a counter reading, said circuit configuration having parts, and said evaluation circuit switching at least said parts to a changed operating mode on the basis of the counter signal; and said parts affecting a clock frequency of the circuit configuration, and said evaluation circuit switching at least said parts affecting the clock frequency to a faster operating mode upon identification of a slow operating state in the circuit configuration.

2. In a circuit configuration for processing data, having a control circuit configured to set a phase or a frequency of a second signal with a prescribed phase or frequency relationship with respect to a first signal, said control circuit having a digital counter for detecting a phase or frequency difference between the first signal and the second signal, and said counter outputting a counter signal acting as a control signal of said control circuit for setting the phase or frequency of the second signal, the improvement which comprises:

an evaluation circuit connected to receive the counter signal and configured to assess an operating state of the circuit configuration on a basis of a counter reading, said circuit configuration having parts, and said evaluation circuit switching at least said parts to a changed operating mode on the basis of the counter signal; and said parts affecting a clock frequency of the circuit configuration, and said evaluation circuit switching at least said parts affecting the clock frequency to a slower operating mode upon identification of a fast operating state in the circuit configuration.

3. In a circuit configuration for processing data, having a control circuit configured to set a phase or a frequency of a second signal with a prescribed phase or frequency relationship with respect to a first signal, said control circuit having a digital counter for detecting a phase or frequency difference between the first signal and the second signal, and said counter outputting a counter signal acting as a control signal of said control circuit for setting the phase or frequency of the second signal, the improvement which comprises:

an evaluation circuit connected to receive the counter signal and configured to assess an operating state of the circuit configuration on a basis of a counter reading, said circuit configuration having parts, and said evaluation circuit switching at least said parts to a changed operating mode on the basis of the counter signal; and at least one voltage generator, said voltage generator connected to said evaluation circuit, and said evaluation circuit switching said voltage generator to an operating state having a relatively low power consumption during which said voltage generator supplies less power following identification of a low-power operating mode in the circuit configuration.

4. In a circuit configuration for processing data, having a control circuit configured to set a phase or a frequency of a second signal with a prescribed phase or frequency relationship with respect to a first signal, said control circuit having a digital counter for detecting a phase or frequency difference between the first signal and the second signal, and said counter outputting a counter signal acting as a control signal of said control circuit for setting the phase or frequency of the second signal, the improvement which comprises:

an evaluation circuit connected to receive the counter signal and configured to assess an operating state of the circuit configuration on a basis of a counter reading, said circuit configuration having parts, and said evaluation circuit switching at least said parts to a changed operating mode on the basis of the counter signal;

a driver circuit, and said evaluation circuit changing a driver strength of said driver circuit on the basis of the counter signal.

5. In a circuit configuration for processing data, having a control circuit configured to set a phase or a frequency of a second signal with a prescribed phase or frequency relationship with respect to a first signal, said control circuit having a digital counter for detecting a phase or frequency difference between the first signal and the second signal, and said counter outputting a counter signal acting as a control signal of said control circuit for setting the phase or frequency of the second signal, the improvement which comprises:

an evaluation circuit connected to receive the counter signal and configured to assess an operating state of the circuit configuration on a basis of a counter reading;

a data memory connected to said evaluation circuit, said data memory storing limit values for the counter signal defining operating states of the circuit configuration;

said evaluation circuit ascertaining the operating state in the circuit configuration by comparing the counter signal with the stored limit values; and wherein a frequency of the first signal is ascertained and supplied to said evaluation circuit;

said evaluation circuit is configured to take into account the counter reading and the frequency of the first signal when assessing the operating state of the circuit configuration; and the limit values are defined on the basis of the frequency.

6. In a circuit configuration for processing data, having a control circuit configured to set a phase or a frequency of a second signal with a prescribed phase or frequency relationship with respect to a first signal, said control circuit having a digital counter for detecting a phase or frequency difference between the first signal and the second signal, and said counter outputting a counter signal acting as a control signal of said control circuit for setting the phase or frequency of the second signal, the improvement which comprises:

an evaluation circuit connected to receive the counter signal and configured to assess an operating state of the circuit configuration on a basis of a counter reading;

a data memory connected to said evaluation circuit, said data memory storing values of the counter signal corresponding to temperature ranges of the circuit configuration; and said evaluation circuit identifying a temperature range for the circuit configuration by comparing the counter signal output by said counter with the stored values of the counter signal.

7. In a circuit configuration for processing data, having a control circuit configured to set a phase or a frequency of a second signal with a prescribed phase or frequency relationship with respect to a first signal, said control circuit having a digital counter for detecting a phase or frequency difference between the first signal and the second signal, and said counter outputting a counter signal acting as a control signal of said control circuit for setting the phase or frequency of the second signal, the improvement which comprises:

an evaluation circuit connected to receive the counter signal and configured to assess an operating state of the circuit configuration on a basis of a counter reading;

a data memory connected to said evaluation circuit, said data memory storing values of the counter signal corresponding to operating frequencies for the circuit configuration; and said evaluation circuit identifying an operating frequency for the circuit configuration by comparing the counter signal output by said counter with the stored values of the counter signal.

8. The circuit configuration according to claim 1 formed on a semiconductor memory chip.

* * * * *